United States Patent
Cory et al.

[11] Patent Number: 5,539,315
[45] Date of Patent: Jul. 23, 1996

[54] NMR PROBE FOR CROSS-POLARIZATION MEASUREMENTS

[75] Inventors: David G. Cory, Winchester; Joel T. Lewandowski, Oxford; Werner E. Maas, Billerica, all of Mass.

[73] Assignee: Bruker Instruments, Inc., Billerica, Mass.

[21] Appl. No.: 410,095

[22] Filed: Mar. 24, 1995

[51] Int. Cl.$^6$ .................................................. G01R 33/20
[52] U.S. Cl. .......................... 324/318; 324/314; 335/299
[58] Field of Search ............................ 324/318, 316, 324/322, 307, 309, 300, 313, 314; 128/653.2, 653.5; 335/299, 282, 296; 336/180, 182, 222

[56] References Cited

U.S. PATENT DOCUMENTS

| | | | |
|---|---|---|---|
| 4,717,880 | 1/1988 | Ono et al. | 324/318 |
| 4,799,016 | 1/1989 | Rezuani | 324/318 |
| 5,038,105 | 8/1991 | Codrington | 324/318 |
| 5,192,911 | 3/1993 | Hill et al. | 324/322 |
| 5,227,756 | 7/1993 | Hed | 335/299 |
| 5,311,134 | 5/1994 | Yamagata et al. | 324/318 |

*Primary Examiner*—Sandra L. O'Shea
*Assistant Examiner*—Raymond Y. Mah
*Attorney, Agent, or Firm*—Bookstein & Kudirka

[57] ABSTRACT

A nuclear magnetic resonance cross polarization probe uses a dual-coil arrangement in which a single-turn inner coil is surrounded by a solenoid coil. The inner coil is tuned to the frequency of a relatively high Larmor frequency nuclei type, such as proton. The solenoid coil is tuned to a lower Larmor frequency nuclei type. An inner sample region surrounded by the inner coil has a first magnetic field component induced by an electrical signal at the relatively high frequency in the inner coil. An electrical signal at the lower frequency is input to the solenoid coil and results in the generation of a magnetic field alternating at the lower frequency. This field induces a current in the inner coil at the lower frequency that, in turn, induces a magnetic field component in the inner region at the lower frequency. Because the structure of the relatively high magnetic field component and the lower magnetic field component in the inner region are both dictated by the shape of the inner coil, a good spatial matching of the fields is obtained resulting in a good Hartman-Hahn match across the sample volume.

12 Claims, 6 Drawing Sheets

NMR PROBE FOR CROSS-POLARIZATION MEASUREMENTS

BACKGROUND OF THE INVENTION

1. Field of the Invention

This invention relates to solid state NMR spectroscopy and, in particular, to probes for cross polarization studies at high static magnetic field strengths.

2. Description of the Related Art

Many nuclei possess a magnetic moment. Nuclear magnetic resonance (NMR) is a phenomenon exhibited by this select group of atomic nuclei (termed "NMR active" nuclei), and is based upon the interaction of the nucleus with an applied, external magnetic field. The magnetic properties of a nucleus are conveniently discussed in terms of two quantities: the gyromagnetic ratio ($\gamma$); and the nuclear spin (I). When an NMR active nucleus is placed in a magnetic field, its nuclear magnetic energy levels are split in to (2I+1) non-degenerate energy levels, that are separated from each other by an energy that is directly proportional to the strength of the applied magnetic field. This splitting is called the "Zeeman" splitting and is equal to $\gamma h H_0/2\pi$, where h is Plank's constant and $H_0$ is the strength of the magnetic field. The frequency corresponding to the energy of the Zeeman splitting ($w_0=\gamma H_0$) is called the "Larmor frequency." When a bulk sample containing NMR active nuclei is placed within a magnetic field, the nuclear spins distribute themselves amongst the nuclear magnetic energy levels in accordance with Boltzmann's statistics. This results in a population imbalance between the energy levels and a net nuclear magnetization. It is this net nuclear magnetization that is studied by NMR. Typical NMR active nuclei include $^1H$ (protons), $^{13}C$, $^{19}F$, and $^{31}P$. For these four nuclei I=½, and each nucleus has two nuclear magnetic energy levels.

At equilibrium the net nuclear magnetization is aligned with the external magnetic field and is time-independent. A second magnetic field perpendicular to the first and rotating at or near the Larmor frequency induces a coherent motion (a "nutation") of the net nuclear magnetization. Since, at conventional field strengths, the Larmor frequency is in the megahertz range, this second field is called a "radio frequency field" (RF field). The effect of the RF field is to rotate the spin magnetization about the direction of the applied RF field. By convention, an RF pulse of sufficient length to nutate the nuclear magnetization through an angle of 90°, or $\pi/2$ radians, is called a "$\pi/2$ pulse."

A $\pi/2$ pulse applied near resonance will rotate the spin magnetization that was along the external magnetic field direction into a plane perpendicular to the external magnetic field. The component of the net magnetization that is transverse to the external magnetic field precesses about the external magnetic field at the Larmor frequency. This precession can be detected with a resonant coil placed such that the precessing magnetization induces a voltage across the coil. Frequently, the "transmitter coil" employed for nutating the spin magnetization and the "receiver coil" for detecting the magnetization are one in the same.

In addition to precessing at the Larmor frequency, the magnetization also undergoes two relaxation processes: (1) dephasing within the transverse plane ("spin-spin relaxation") with an associated relaxation time, $T_2$; and (2) a return to the equilibrium population of the nuclear magnetic energy levels ("spin-lattice relaxation") with an associated relaxation time, $T_1$.

The nuclear magnetic moment experiences an external magnetic field that is reduced from the actual field due to a screening from the surrounding electron cloud. This screening results in a slight shift of the Larmor frequency (called the "chemical shift" since the size and symmetry of the shielding is dependent on the chemical composition of the sample).

In addition to the applied external magnetic field, the nuclei are also subject to local magnetic fields such as those generated by other nuclear and electron magnetic moments. Interactions between these magnetic moments are called "couplings," and one important example of such couplings is the "dipolar" coupling. In solids, the NMR spectra of spin=½ nuclei are often dominated by dipolar couplings, and in particular by dipolar couplings to adjacent protons.

A class of experiments called cross-polarization (CP) are widely used to enhance the sensitivity of NMR experiments in the solid state. Among other factors, the sensitivity in NMR is directly related to the resonance frequency of the nuclei of interest since this is a measure of the energy splitting of the nuclear spin levels. This energy difference is the determining factor for the population distribution of spins at equilibrium. Since the energy splitting in NMR is very small, the experiment is carried out in a high temperature regime where the signal-to-noise ratio is directly proportional to the resonance frequency (all else being constant).

Organic solids contain an abundance of protons which are dipolarly coupled to the other spins in the sample. Since protons have a much higher resonance frequency than the other spins, and since the natural abundance of $^1H$ is generally much higher than the abundance of other (hetero) nuclei that are of interest, these protons can be thought of as representing a large bath of magnetization. The prefix "hetero" in this case can be taken to mean non-proton. The cross polarization experiment polarizes the hetero spins by extracting polarization from the proton bath rather than by relying on thermal mixing with the lattice to generate a new Boltzmann population difference. Since the Boltzmann population difference for proton is much higher, the polarization so generated will be substantially greater than that which would be reached thermally, this represents an increase in the sensitivity of the experiment.

There is an additional benefit to the CP experiment. It takes some time (called the spin-lattice relaxation time) for the nuclear spins and the lattice to come into equilibrium. This time is normally much shorter for protons than for hetero nuclei and, therefore, the measurements can be repeated more quickly if the polarization is re-established through the proton channel following each excitation.

Given the potential benefits of CP, the question remains of how to efficiently transfer energy from the proton to heteronuclear channels. This has not be accomplished in the normal laboratory frame because the spins have quite different resonance frequencies and, as a result, make conservative energy exchange impossible.

Exchange is possible in a "double-rotating" frame. If an on-resonance RF field is applied to the spin system, one can transform into an interaction frame where the RF field appears stationary and, by so doing, the applied external magnetic field vanishes. In this reference frame, the field encountered by the spins appears as static RF field having an amplitude of $\gamma B_1$. If the ratio of the field strengths between the proton field and the field of the hetero nucleus is made inversely proportional to the difference in the respective values of $\gamma$ for the two nuclei, the spins are energy-matched, and can efficiently exchange polarization. For example, since the values of γ for proton and γ for carbon differ by a factor of approximately four, the carbon field strength ($B_1$) can be made four times as strong as the proton field strength. In the double rotating frame (both carbon and proton RF fields applied), the spins are then energy matched and can efficiently exchange polarization.

The above matching of the two RF field strengths is termed the Hartman-Hahn match condition and is an efficient means of polarization transfer. The overall process is called cross polarization, and is diagramed in FIG. 1. The method starts by exciting the $^1H$ resonance with a 90° ($\pi/2$) pulse and then spin-locking this by shifting the phase of the proton RF field by 90°. The proton spins and the RF field are now along the same direction and the magnetization is "locked" in the rotating frame. At this time, an RF field at the X frequency (the approximate Larmor frequency of the hetero nuclei) is applied with strength set by the Hartman-Hahn condition so that the hetero nuclei magnetization builds up at the expense of the proton magnetization. After a suitable period (typically a few milli-seconds) the X-frequency RF field is switched off and the hetero nuclei NMR signal is measured. Since the proton and heteronuclei are dipolarly coupled, this detection is normally carried out with proton decoupling.

The degree to which the two RF fields must be matched to have an efficient (i.e. fast) cross polarization is quite high. If two separate coils are employed, the RF inhomogeneity of the two coils will vary independently in space and, at best, only a small portion of the sample will be in a region of good Hartman-Hahn match. This has led to the idea that such an experiment is only feasible with a doubly-tuned single coil probe.

When a single RF coil is double tuned to the proton frequency and a lower (heteronuclear) frequency, the efficiency at each frequency is less than optimal. In particular, while one might otherwise use a high inductance coil for the low frequency channel, the requirement that the coil be tunable at high frequencies precludes such a use.

FIG. 2 shows a schematic picture of a typical prior art doubly-tuned NMR probe suitable for cross polarization studies. The sample is surrounded by a single RF coil 10 which is tuned to both the $^1H$ and X frequencies. Two quarter-wave lines at the $^1H$ frequency are provided, quarter-wave line 12 being open-circuited and quarter-wave line 14 being short circuited. Quarter-wave line 12 acts as a ground for the $^1H$ frequency signal and quarter-wave line 14 acts as a ground for the X frequency signal. Thus, these lines provide some isolation between the two RF channels.

SUMMARY OF THE INVENTION

The present invention provides a new nuclear magnetic resonance (NMR) probe that is specifically designed to improve the performance of cross-polarization, magic angle spinning (CP/MAS) experiments. The probe makes use of two RF coils, each coil being singly tuned. One of the coils is tuned to a higher frequency corresponding to a higher Larmor frequency nuclei type (e.g. proton), while the other is tuned to a lower frequency corresponding to a lower Larmor frequency nuclei type (the X or "hetero" nuclei). A good matching of the RF field amplitudes over the sample volume is maintained by locating the higher-frequency coil within the lower-frequency coil, and using the inner coil as a flux concentrator for the outer coil. The flux concentrator arrangement ensures high RF homogeneity for both channels. Furthermore, since two individual coils are used, the inductance of each can be individually optimized resulting in a higher efficiency than is normally achievable.

In the preferred embodiment, the inner coil is a single-turn coil, and consists of a substantially cylindrical conductor with a longitudinal gap along the length of its surface. The thickness of the cylinder is much greater than the skin depth of either the higher frequency or the lower frequency. The inner coil is tuned to the higher frequency and generates an oscillating RF field along the longitudinal axis of the cylinder approximated by the coil.

The outer coil of the preferred embodiment is a solenoid coil and is wrapped around the inner coil, without actually making conductive contact with the inner coil. The interaction of the field of the outer coil with the inner coil is such that the inner coil acts as a flux concentrator for the field of the outer coil. The lower frequency RF field generated by the outer coil creates a field in the solenoid. This field within the solenoid creates currents in the inner coil which, in turn, induce an RF field within the inner coil. This field is spatially well-aligned with the high frequency field generated by the inner coil, thus providing high cross polarization efficiency.

In an alternative embodiment of the invention, a structure similar to that of the preferred embodiment is employed, but is used to generate a triple resonance. As in the above embodiment, the inner coil is tuned to the high frequency (e.g. that of proton nuclei). However, the outer coil is double-tuned to two lower frequencies. The inner coil receives an input from an input from a first input circuit at a first (high) frequency. The outer solenoid coil receives an input from a second input circuit at a second (lower, heteronuclear) frequency, and a third input from a third input circuit at a third (lower, heteronuclear) frequency. This allows the cross polarization of two hetero nucleus types with the higher, typically proton, hetero nuclei.

In a similar alternative embodiment, the outer solenoid coil is tuned to a single frequency, but the inner coil is double tuned to a first, relatively high frequency and a second, relatively high frequency. The inner coil receives two signal inputs, one from a first input circuit at the first high frequency, and one from a second input circuit at the second high frequency. This allows the cross polarization of two high frequency nucleus types with a lower, hetero nucleus type.

DETAILED DESCRIPTION OF THE PREFERRED EMBODIMENTS

Figure 3:
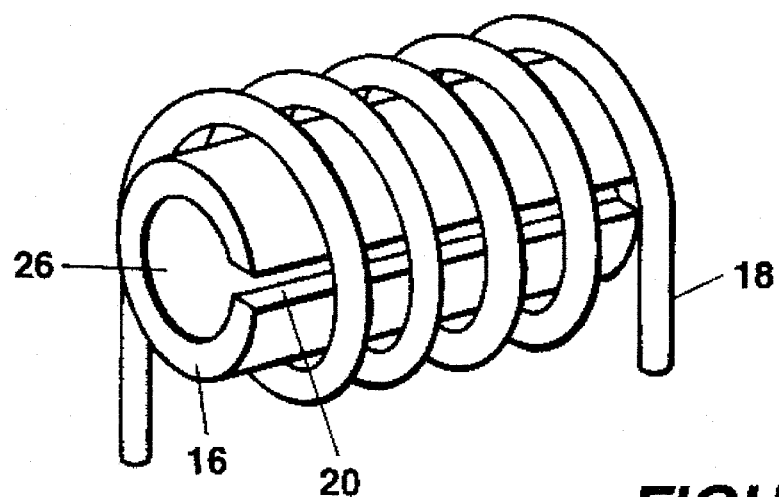
FIG. 3 is a schematic isometric view of a portion of a dual-coil cross polarization probe according to the present invention.

Shown in FIG. 3 is a coil set suitable for use in a nuclear magnetic resonance probe for cross-polarization, magic angle spinning (CP/MAS) experiments. The set consists of two RF coils, a single turn inner coil 16, tuned to a relatively high frequency, and a solenoid coil 18 tuned to a lower frequency. As shown, the solenoid coil 18 is wrapped around the inner coil 16.

The inner coil 16 is tuned to a high frequency type which is approximately equal to the Larmor frequency of the higher frequency nuclei of the two nuclei types which are the subjects of the cross polarization experiment. Typically, this higher frequency nucleus type is proton (i.e. hydrogen nucleus), but it may also be another high Larmor frequency nucleus type. In general, the inner coil 16 is highly efficient. In response to an applied alternating electrical signal, it generates an oscillating RF field at the tuned frequency within an inner region 26 of the coil, along the longitudinal axis of the coil.

The inner coil 16 consists of a single piece of conductive material. The shape of the coil approximates a cylinder with a narrow longitudinal gap that runs the length of the coil. With this shape, the inner coil is optimized for use with relatively high frequencies, such as the Larmor frequency for protons (i.e. approximately 500 MHz at 12 Tesla). In the preferred embodiment, a single piece of copper is used which has a thickness much greater than the skin depth of either the high frequency magnetic field or the lower frequency magnetic field generated by the solenoid coil 18. Because of this minimum thickness, the surface of the coil 16 acts as a barrier to both the high frequency and the lower frequency magnetic fields.

The solenoid coil 18 is wrapped around the inner coil 16 and is of conventional design. The solenoid coil is a many turn coil and, as such, is optimized for lower frequencies, such as those in the range of the Larmor frequency for carbon nuclei (i.e. approximately 125 MHz at 12 Tesla). The solenoid coil 18 is tuned to a frequency which is approximately equal to the Larmor frequency of a second nucleus type of interest. In response to an applied alternating electrical signal, the solenoid coil generates an oscillating RF magnetic field at the tuned frequency of the solenoid coil 18. However, the physical arrangement of the two coils 16, 18 results in a modification of the magnetic field generated by the solenoid coil 18.

Figure 4:
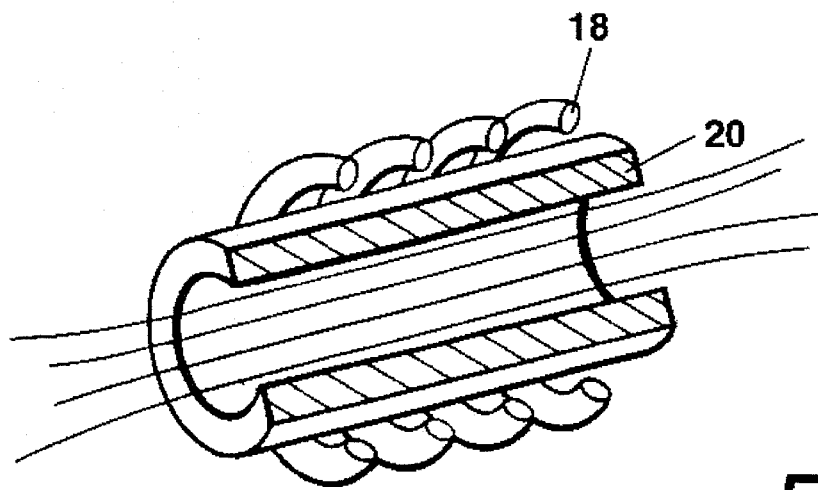
FIG. 4 is a schematic cut away view of the probe shown in FIG. 3 including a diagrammatic representation of RF magnetic field lines within the probe.

In short, inner coil 16 acts as a flux concentrator for the solenoid coil 18. The RF signal in the solenoid coil 18 creates a field that interacts with the inner coil 16 to induce an electrical current in the inner coil 16. This induced current, in turn, create a magnetic field within the inner coil 16 at the tuned frequency of the solenoid coil. The cutaway view of the preferred embodiment is shown in FIG. 4 and provides a schematic depiction of the field lines within the inner coil 16.

Figure 5:
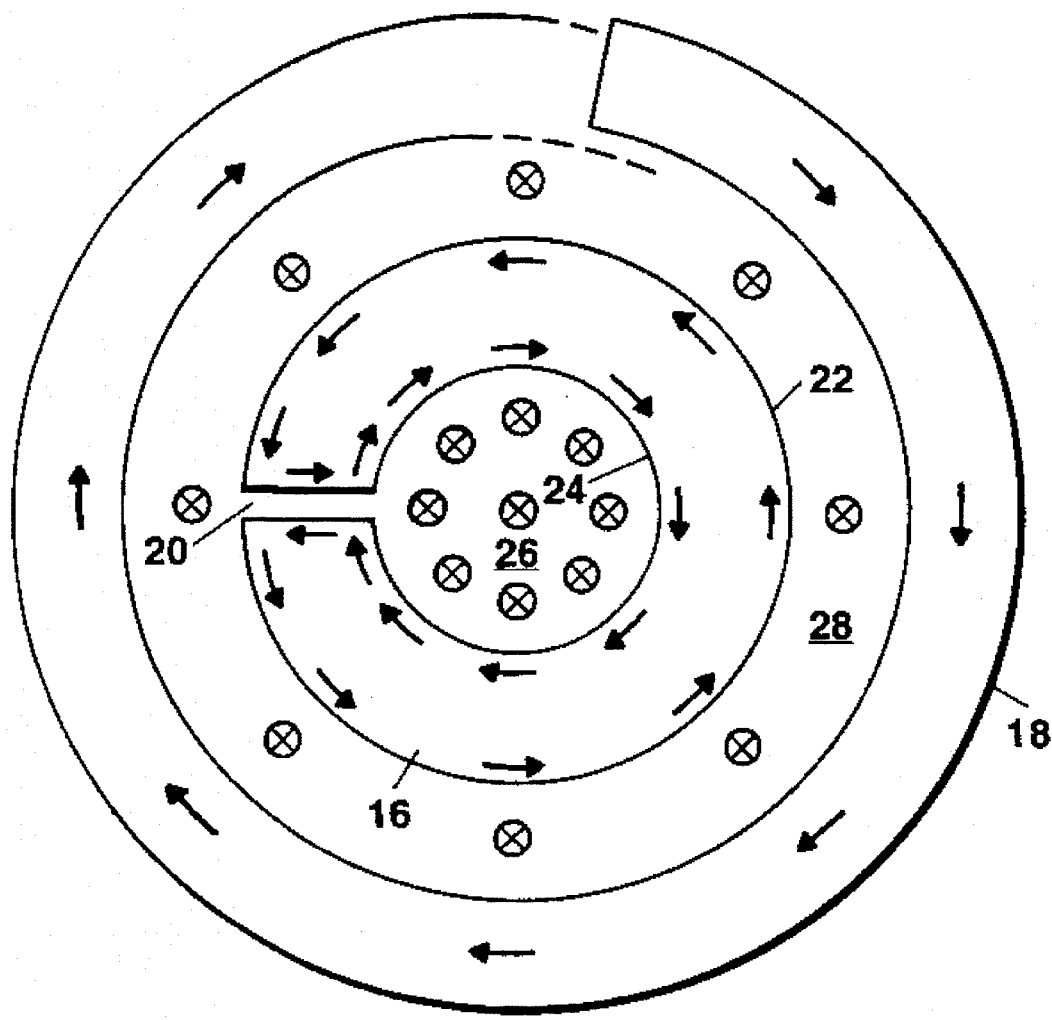
FIG. 5 is a schematic cross-sectional view of a dual-coil probe according to the present invention showing the direction of electrical current and magnetic field lines in the probe.

FIG. 5 is a schematic, cross sectional view of the currents and field lines within the dual-coil structure of the preferred embodiment. The direction of electrical currents in the inner coil 16 and the outer coil 18 is indicated by arrows. Magnetic field lines in the interior regions defined by the two coils are indicated by arrows "into the page" (symbols appearing as an "X" within a circle). The view of FIG. 5 is a cross section of the two coils taken perpendicular to a longitudinal axis of the inner coil. In this figure, the magnetic field lines to the outside of the solenoid coil 18 are not represented. Because the NMR sample is located to the inside of the inner coil 16 (i.e. in inner region 26), the field of interest is the field within that region.

The current in the solenoid coil 18 is shown in a first direction in FIG. 5 to demonstrate the manner in which this current affects the magnetic field in inner region 26. It will be understood by those skilled in the art that an alternating current within this coil 18 will generate an alternating field in which the direction of the resulting magnetic field lines reverses as the current direction reverses. Currents induced by this alternating magnetic field will also reverse with the changing field, as will secondary magnetic fields induced by the induced currents.

As the current in the solenoid coil 18 proceeds in the direction indicated by the arrows in FIG. 5, a magnetic field is induced in the space between the solenoid coil 18 and the inner coil 16 (i.e. intermediate region 28) in the direction indicated by the arrows "into the page." Since the thickness of the surface of the inner coil is greater than the skin depth of the solenoid field, the magnetic field lines from solenoid coil 18 do not extend into inner region 26. However, the magnetic field from the solenoid coil 18 does interact with the inner coil 16 itself to induce an eddy current within the inner coil 16.

With the magnetic field in the intermediate region 28 in the direction indicated in FIG. 5, the resulting eddy current in the inner coil 16 is in the direction indicated by the arrows shown on the surface of the coil 16. Because of the gap 20 in the inner coil 16, a circuit of induced current is formed along the surface of the inner coil 16. The current progresses in one angular direction along an outer surface 22 of the inner coil 16 (relative to a longitudinal axis of the inner coil 16), and in the opposite angular direction along the an inner surface 24 of the inner coil 16. The gap 20 in the surface of the inner coil 16 completes the current path between the inner surface 24 of the coil and the outer surface 22 of the coil. Those skilled in the art will understand that, while the induced current may vary near the ends of the inner coil 16 due to the physical shape of the two-coil probe, the induced alternating surface current is substantially uniform along most of the inner coil 16.

Making continued reference to FIG. 5, the current induced on the surface of the inner coil 16 by the solenoid field, when progressing in the direction indicated by the arrows of FIG. 5, induces a magnetic field in the inner region 26 with a direction indicated by the arrows shown pointing "into the page." As the current induced in the inner coil 16 alternates at the frequency of the solenoid field, the magnetic field induced in the inner region by the eddy current also alternates at the same frequency between a direction "into the page" (the direction shown in FIG. 5) and an opposite direction "out of the page" (not shown). Thus, the lower frequency field is created in the region of the sample under test (i.e. in the inner region 26). Furthermore, the inner coil 16 act like a "flux concentrator," forcing together the flux lines of the lower frequency field in the inner region 26. This increases the magnitude of the lower frequency field in the vicinity of the sample under test over what it would be in the absence of the inner coil 16.

Figure 6:
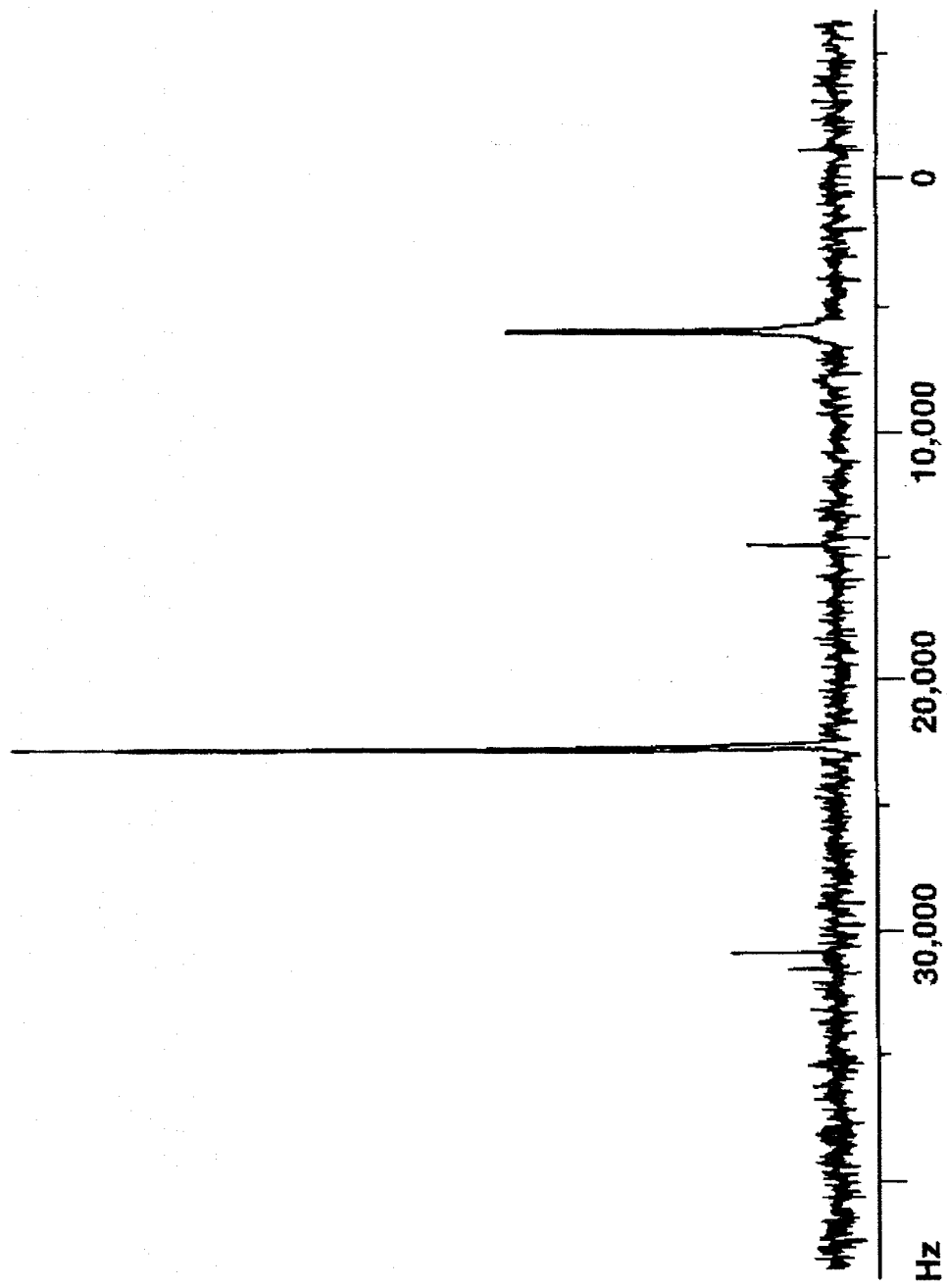
FIG. 6 is a cross polarization/magic angle spinning NMR spectrum of glycine acquired with a probe according to the present invention.

The spatial properties of the lower frequency field created within the inner coil 16 are governed more by the shape of the inner coil 16 than by the geometry of the solenoid coil 18. Thus, the spatial variations in the lower frequency field are also dictated by the shape of the inner coil 16, just as are the spatial variations in the high frequency field. A good field profile match is therefore obtained between the two fields in the vicinity of the sample under test. As such, an excellent cross polarization efficiency is achieved. This efficiency is made evident by the CP/MAS spectrum shown in FIG. 6. This spectrum shows a cross polarization NMR spectrum of glycine, and was acquired using a dual-coil probe according to the present invention. The probe circuit used to generate this spectrum had a high frequency coil tuned to a proton frequency of 500 MHz, and a lower frequency coil tuned to a carbon frequency of 125 MHz.

Figure 7:
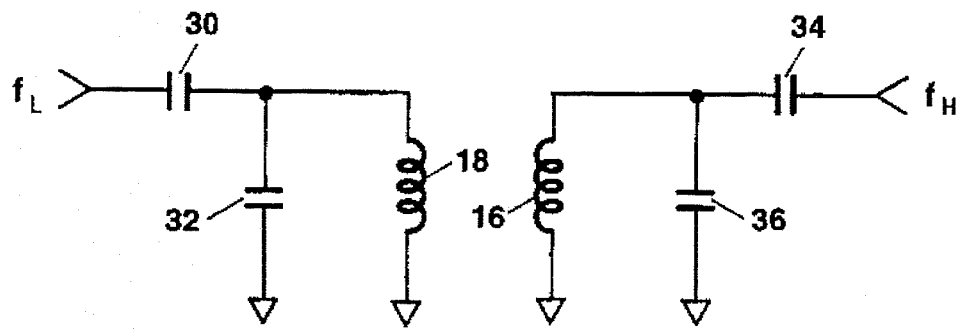
FIG. 7 is an electrical circuit schematic of a dual-coil probe according to the present invention.

Shown schematically in FIG. 7 is a circuit for implementing the dual-coil arrangement of the preferred embodiment. Although shown separately in the circuit schematic, it will be understood that the inner coil 16 and the solenoid coil 18 are physically arranged as shown in FIGS. 3–5. Each of the two coils 16, 18 is separately tuned to a single resonance frequency (the single-turn inner coil 16 being tuned to the high frequency and the solenoid coil being tuned to the lower frequency). By their relative physical arrangement, the coils 16, 18 are flux-linked so as to act as a tuned transformer. High frequency signal $f_H$ is input to inner coil 16, and low frequency signal $f_L$ is input to solenoid coil 18. Capacitors 30, 32, 34, 36 tuning and matching for the two circuits.

Figure 8:
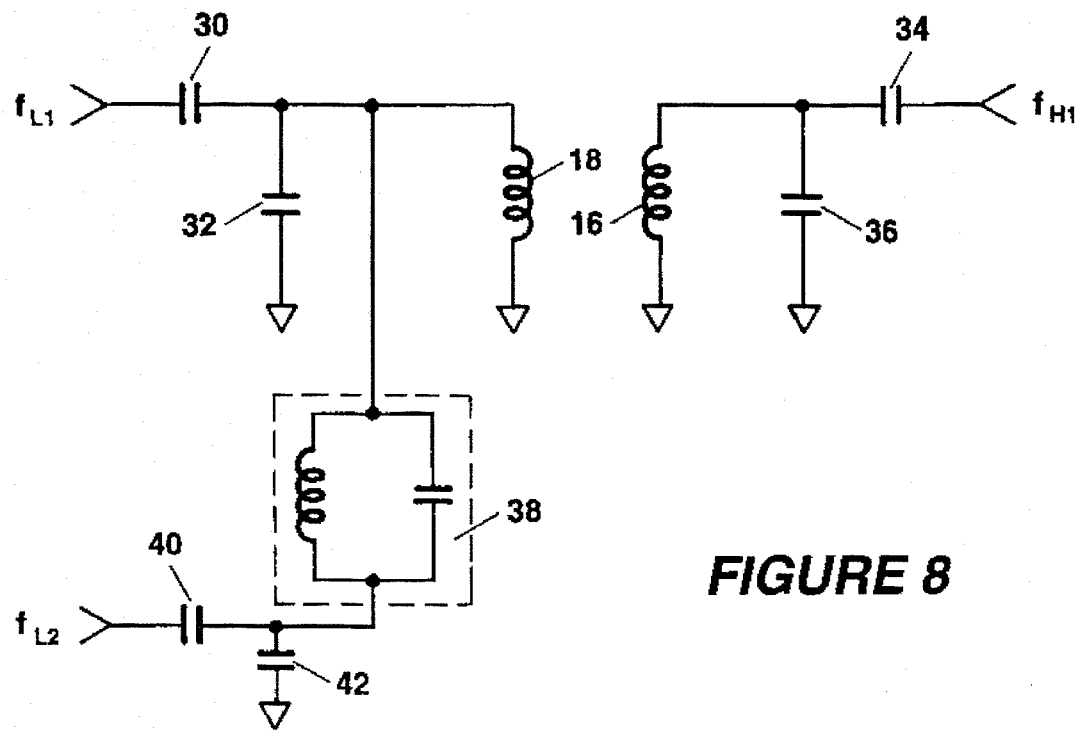
FIG. 8 is an electrical circuit schematic of a dual-coil probe for which the outer coil is double-tuned.

Shown in FIG. 8 is a circuit schematic of an alternative embodiment of the present invention. In the FIG. 8 embodiment, the same physical arrangement of inner coil 16 and solenoid coil 18 is used (as shown in FIGS. 3–5), but the lower frequency solenoid coil is tuned to two different frequencies $f_{L1}$ and $f_{L2}$. The double tuning of a single coil is known in the art, and the double tuning of solenoid coil 18 is done in a conventional manner. However, because of the physical arrangement of the two coils 16, 18, the double-tuning of the solenoid coil 18 results in a three-way cross polarization of three different nuclei types corresponding, respectively, to the high frequency nuclei (typically proton) and the two lower frequency nuclei having Larmor frequencies approximately equal to $f_{L1}$ and $f_{L2}$.

In the FIG. 8 embodiment, the two lower frequency nuclei types preferably have Larmor frequencies which are much lower than the proton frequency. Although not necessary, the embodiment of FIG. 8 preferably makes use of a "trap" 38 which provides isolation between the two lower frequency input signals $f_{L1}$ and $f_{L2}$. In the embodiment of FIG. 8, with $f_{L2}$ being a lower frequency than $f_{L1}$, the trap 38 is a series resonant circuit tuned to $f_{L1}$. As such, the trap blocks the $f_{L1}$ signal, while allowing the higher frequency $f_{L2}$ frequency to pass through it. Capacitors 40, 42 provide tuning and matching for $f_{L2}$.

Figure 1:
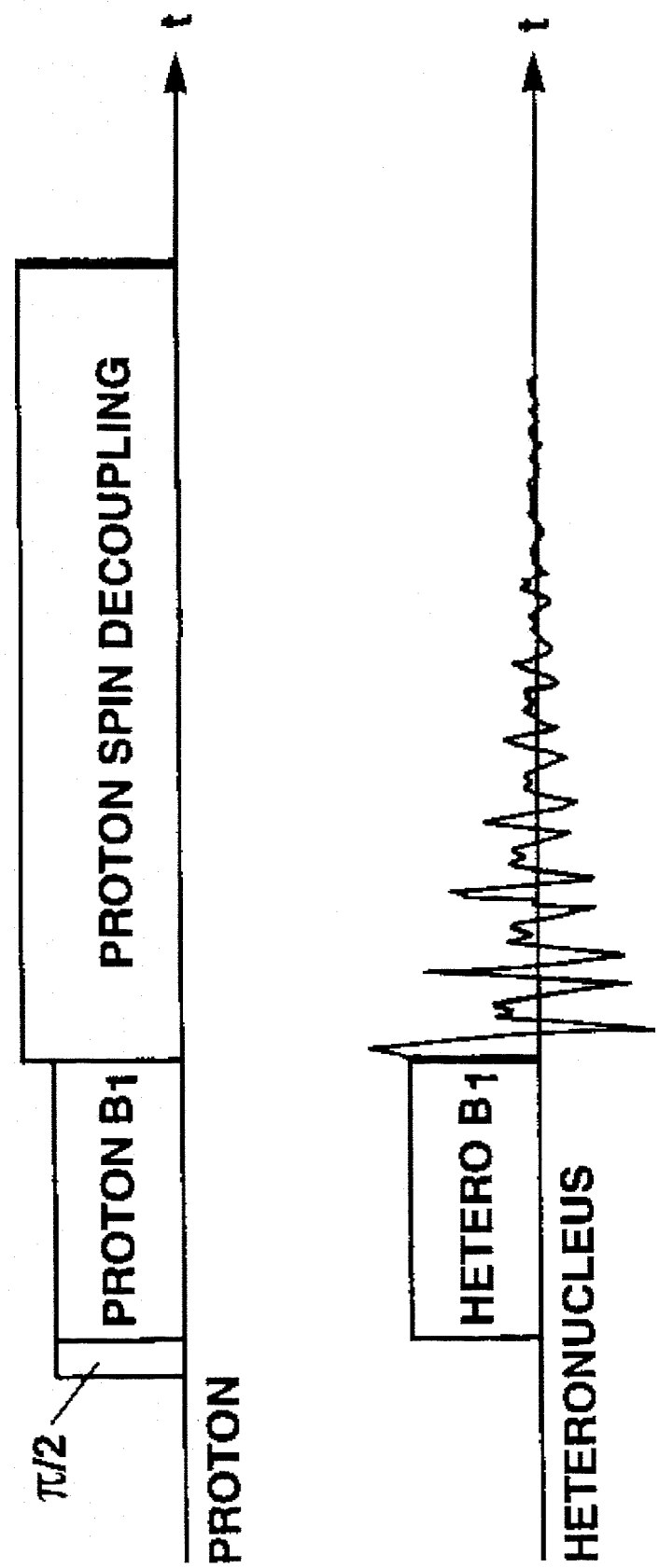
FIG. 1 is a schematic depiction of a prior art cross polarization experiment.
Figure 2:
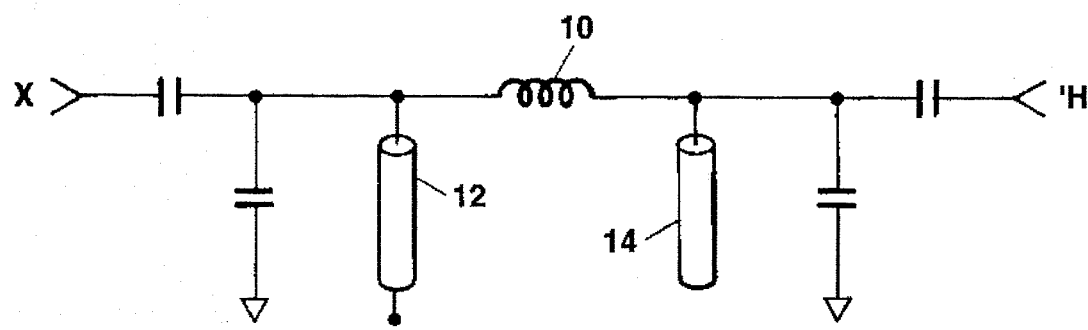
FIG. 2 is a simplified electrical schematic diagram of a prior art NMR probe for cross polarization studies.
Figure 9:
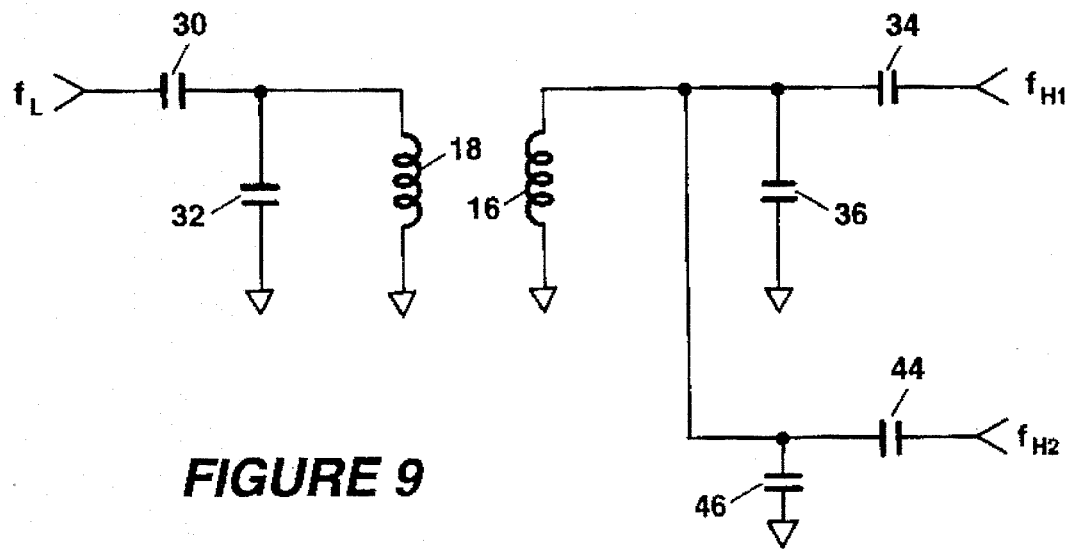
FIG. 9 is an electrical circuit schematic of a dual-coil probe for which the inner coil is double-tuned.

In another alternative embodiment of the invention, the inner coil 16 is double-tuned rather than the solenoid coil 18. FIG. 9 is a schematic of a probe circuit of this type. High frequencies $f_{H1}$ and $f_{H2}$ are relatively close in frequency and are both coupled into inner coil 16. Typically, one of the high frequencies is approximately equal to the Larmor frequency of proton, while the other high frequency is approximately equal to the Larmor frequency of another high frequency nuclei, such as Flourine or Phosphorus. The circuit of FIG. 9 provides three-way cross polarization coupling between two types of high frequency nuclei and a lower frequency nuclei type. Capacitors 44, 46 provide tuning and matching for input signal $f_{H2}$.

While the invention has been shown and described with regard to a preferred embodiment thereof, it will be understood by those skilled in the art that various changes in form and detail may be made therein without exceeding the scope of the invention as defined by the appended claims.

What is claimed is:

1. A magnetic field generator comprising:

a single-turn, inner coil tuned to a first, relatively high frequency to which a first alternating electrical signal is applied at the first frequency to generate a first magnetic field component in an inner region surrounded by the inner coil, the first magnetic field component alternating at the first frequency; and an outer coil tuned to a second, relatively low frequency to which a second alternating electrical signal is applied at the second frequency, the outer coil surrounding the inner coil such that a magnetic field generated by the outer coil induces a current in the inner coil at the second frequency, and said current induces a second magnetic field component in the inner region at the second frequency.

2. A magnetic field generator according to claim 1 wherein the inner coil has a thickness greater than the skin depth of either the first magnetic field component or the second magnetic field component.

3. A magnetic field generator according to claim 1 wherein the shape of the inner coil approximates a cylinder with a gap along its surface parallel to a longitudinal axis of the cylinder and the outer coil is a solenoid coil.

4. A magnetic field generator according to claim 1 wherein the generator is the RF magnetic source for a nuclear magnetic resonance cross polarization probe.

5. A magnetic field generator according to claim 1 wherein the outer coil is double-tuned to both the second frequency and a third, relatively low frequency and wherein, in addition to the second alternating electrical signal, a third electrical signal which alternates at the third frequency is applied to the outer coil such that the magnetic field induced in the inner region has frequency components which include the third frequency.

6. A magnetic field generator according to claim 1 wherein the inner coil is double-tuned to both the first frequency and a third, relatively high frequency and wherein, in addition to the first alternating electrical signal, a third electrical signal which alternates at the third frequency is applied to the inner coil such that the magnetic field induced in the inner region has frequency components which include the third frequency.

7. A cross polarization nuclear magnetic resonance probe for establishing cross polarization coupling between a first nuclei type having a first, relatively high Larmor frequency and a second nuclei type having a second, lower Larmor frequency, the probe comprising:

an inner, single-turn coil tuned to a frequency approximately equal to the first frequency and generating an alternating magnetic field at the first frequency, the coil surrounding an inner region in which a sample containing the first nuclei type and the second nuclei type is located;

an outer, solenoid coil tuned to a frequency approximately equal to the second frequency and generating an alternating magnetic field at the second frequency, the outer coil surrounding the inner coil.

8. A probe according to claim 7 wherein the inner coil is double-tuned to the first frequency and a third frequency, the third frequency being approximately equal to a Larmor frequency of a third nuclei type of interest which is located in the inner region.

9. A probe according to claim 7 wherein the outer coil is double-tuned to the second frequency and a third frequency, the third frequency being approximately equal to a Larmor frequency of a third nuclei type of interest which is located in the inner region.

10. A method of cross-polarizing a plurality of nuclei types of interest in a nuclear magnetic resonance experiment, the method comprising:

surrounding a sample containing said nuclei types of interest with a single-turn inner coil tuned to a first frequency, the first frequency being approximately equal to a Larmor frequency of a first one of the nuclei types;

inputting an electrical signal alternating at the first frequency to the inner coil so as to induce a magnetic field component alternating at the first frequency in the inner region;

surrounding the inner coil with a solenoid coil tuned to a second frequency, the second frequency being approximately equal to a Larmor frequency of a second one of the nuclei types; and inputting an electrical signal alternating at the second frequency to the solenoid coil so as to induce a current component in the inner coil at the second frequency, the induced current inducing a magnetic field component in the inner region which alternates at the second frequency.

11. A method according to claim 10 further comprising double-tuning the inner coil to the first frequency and to a third frequency, and inputting an electrical signal to the inner coil which alternates at the third frequency, the third frequency being approximately equal to a Larmor frequency of a third one of the nuclei types of interest.

12. A method according to claim 10 further comprising double-tuning the outer coil to the second frequency and to a third frequency, and inputting an electrical signal to the solenoid coil which alternates at the third frequency, the third frequency being approximately equal to a Larmor frequency of a third one of the nuclei types of interest.

* * * * *